United States Patent
Zang et al.

(10) Patent No.: US 12,062,670 B2
(45) Date of Patent: Aug. 13, 2024

(54) PIXEL LAYOUT WITH PHOTODIODE REGION PARTIALLY SURROUNDING CIRCUITRY

(71) Applicant: OMNIVISION TECHNOLOGIES, INC., Santa Clara, CA (US)

(72) Inventors: Hui Zang, San Jose, CA (US); Yuanliang Liu, San Jose, CA (US); Keiji Mabuchi, Los Altos, CA (US); Gang Chen, San Jose, CA (US); Bill Phan, San Jose, CA (US); Duli Mao, Sunnyvale, CA (US); Takeshi Takeda, Yokohama (JP)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 342 days.

(21) Appl. No.: 17/243,024

(22) Filed: Apr. 28, 2021

(65) Prior Publication Data
US 2022/0352220 A1 Nov. 3, 2022

(51) Int. Cl.
*H01L 27/146* (2006.01)
(52) U.S. Cl.
CPC .. *H01L 27/14607* (2013.01); *H01L 27/14612* (2013.01); *H01L 27/1463* (2013.01)
(58) Field of Classification Search
CPC ......... H01L 27/14607; H01L 27/14612; H01L 27/1463
See application file for complete search history.

(56) References Cited

U.S. PATENT DOCUMENTS

| | | | |
|---|---|---|---|
| 8,426,796 B2 | 4/2013 | Mao et al. | |
| 8,581,307 B1 | 11/2013 | Chen et al. | |
| 10,334,191 B1 | 6/2019 | Yang et al. | |
| 2007/0045679 A1 | 3/2007 | McKee et al. | |
| 2007/0120214 A1* | 5/2007 | Cole | H01L 27/1463 257/461 |
| 2009/0194800 A1* | 8/2009 | Lee | H01L 27/14647 257/292 |
| 2015/0279883 A1* | 10/2015 | Manouvrier | H01L 27/1463 257/225 |

(Continued)

OTHER PUBLICATIONS

B. Shin et al., "The effect of photodiode shape on charge transfer in CMOS image sensors," Solid-State Electronics, 54(11):1416-1420, Nov. 2010.

(Continued)

*Primary Examiner* — Thao X Le
*Assistant Examiner* — Sean Ayers Winters
(74) *Attorney, Agent, or Firm* — Christensen O'Connor Johnson Kindness PLLC

(57) ABSTRACT

An image sensor comprises a first photodiode region and circuitry. The first photodiode region is disposed within a semiconductor substrate proximate to a first side of the semiconductor substrate to form a first pixel. The first photodiode region includes a first segment coupled to a second segment. The circuitry includes at least a first electrode associated with a first transistor. The first electrode is disposed, at least in part, between the first segment and the second segment of the first photodiode region such that the circuity is at least partially surrounded by the first photodiode region when viewed from the first side of the semiconductor substrate.

28 Claims, 10 Drawing Sheets

(56) References Cited

U.S. PATENT DOCUMENTS

| | | | |
|---|---|---|---|
| 2015/0372034 A1* | 12/2015 | Chen | H01L 27/14614 |
| | | | 257/334 |
| 2017/0040364 A1* | 2/2017 | Oh | H01L 27/14636 |
| 2017/0200757 A1* | 7/2017 | Ihara | H01L 27/14634 |
| 2018/0006076 A1* | 1/2018 | Goto | H01L 31/105 |
| 2018/0286897 A1* | 10/2018 | Watanabe | H01L 27/14683 |
| 2019/0131331 A1* | 5/2019 | Lee | H01L 27/14689 |
| 2019/0148448 A1* | 5/2019 | Lee | H01L 27/14627 |
| | | | 257/431 |
| 2020/0098798 A1* | 3/2020 | Takahashi | H01L 27/1461 |
| 2021/0029321 A1* | 1/2021 | Ma | H01L 27/14641 |

OTHER PUBLICATIONS

A. Pelamatti et al., "Absolute Pinning Voltage Measurement: Comparison between In-pixel and JFET Extraction Methods," International Image Sensor Workshop (ISW), Vaals, The Netherlands, Jun. 2015.

V. Goiffon et al., "On the Pixel Level Estimation of Pinning Voltage, Pinned Photodiode Capacitance and Transfer Gate Channel Potential," International Image Sensor Workshop (ISW), Snowbird, UT, USA, Jun. 2013.

\* cited by examiner

X2-X2'

X3-X3'

Y4-Y4'

Y5-Y5'

PIXEL LAYOUT WITH PHOTODIODE REGION PARTIALLY SURROUNDING CIRCUITRY

TECHNICAL FIELD

This disclosure relates generally to image sensors, and in particular but not exclusively, relates to the pixel layout of CMOS image sensors.

BACKGROUND INFORMATION

Image sensors have become ubiquitous and are now widely used in digital cameras, cellular phones, security cameras, as well as, medical, automobile, and other applications. As image sensors are integrated into a broader range of electronic devices it is desirable to enhance their functionality, performance metrics, and the like in as many ways as possible (e.g., resolution, power consumption, dynamic range, etc.) through both device architecture design as well as image acquisition processing.

The typical image sensor operates in response to image light reflected from an external scene being incident upon the image sensor. The image sensor includes an array of pixels having photosensitive elements (e.g., photodiodes) that absorb a portion of the incident image light and generate image charge upon absorption of the image light. The image charge of each of the pixels may be measured as an output voltage of each photosensitive element that varies as a function of the incident image light. In other words, the amount of image charge generated is proportional to the intensity of the image light, which is utilized to produce a digital image (i.e., image data) representing the external scene.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale, emphasis instead being placed upon illustrating the principles being described.

Figure 2A:
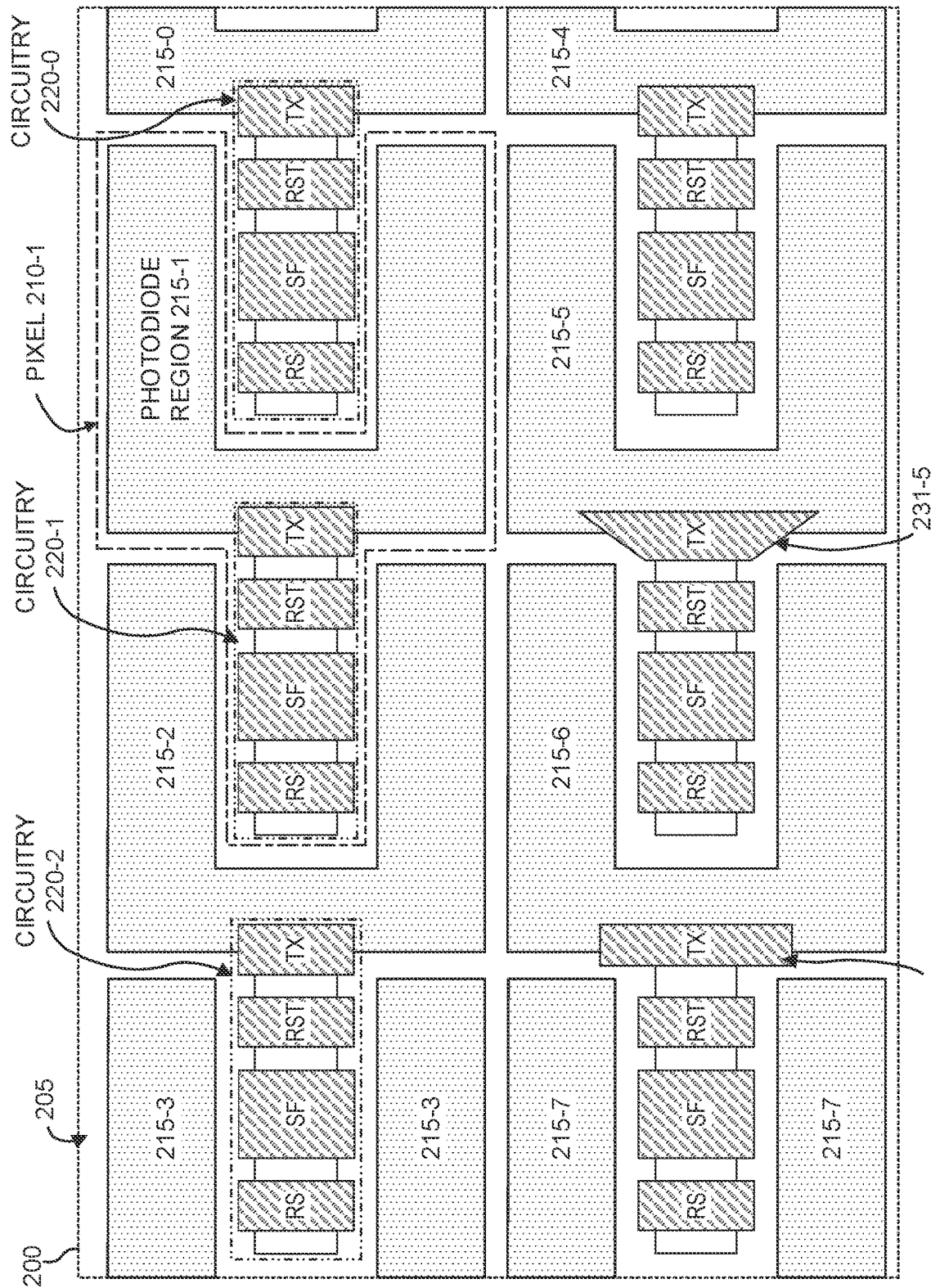
FIG. 2A illustrates a top view of an image sensor with a first example pixel layout including a photodiode region that partially surrounds circuitry, in accordance with the teachings of the present disclosure.
Figure 2B:
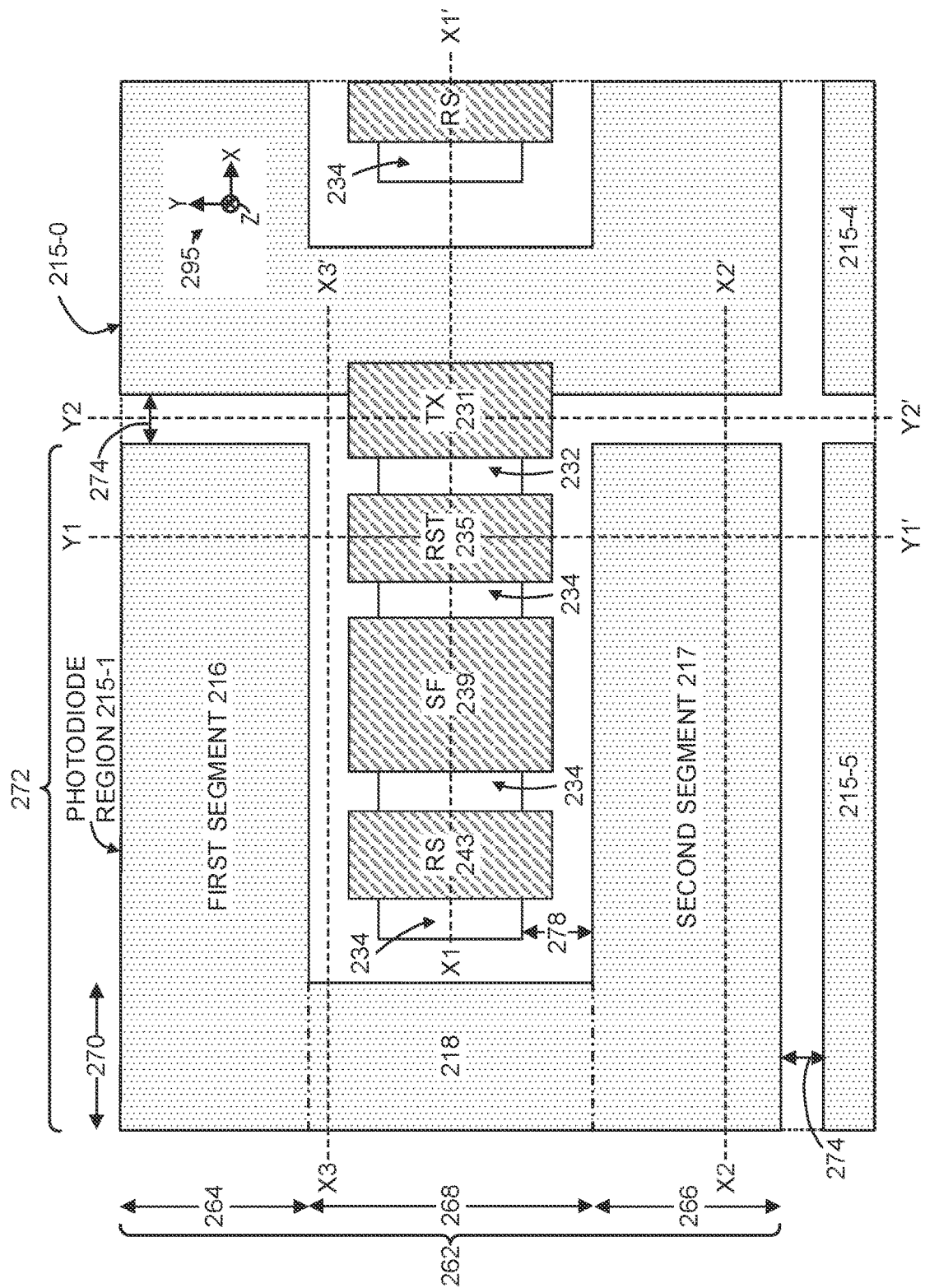
FIG. 2B illustrates a magnified view of the view shown in FIG. 2A, in accordance with the teachings of the present disclosure.

FIG, 2C illustrates a cross-sectional view along the line X1-X1' shown in FIG. 2B, in accordance with the teachings of the present disclosure.

Figure 2C:
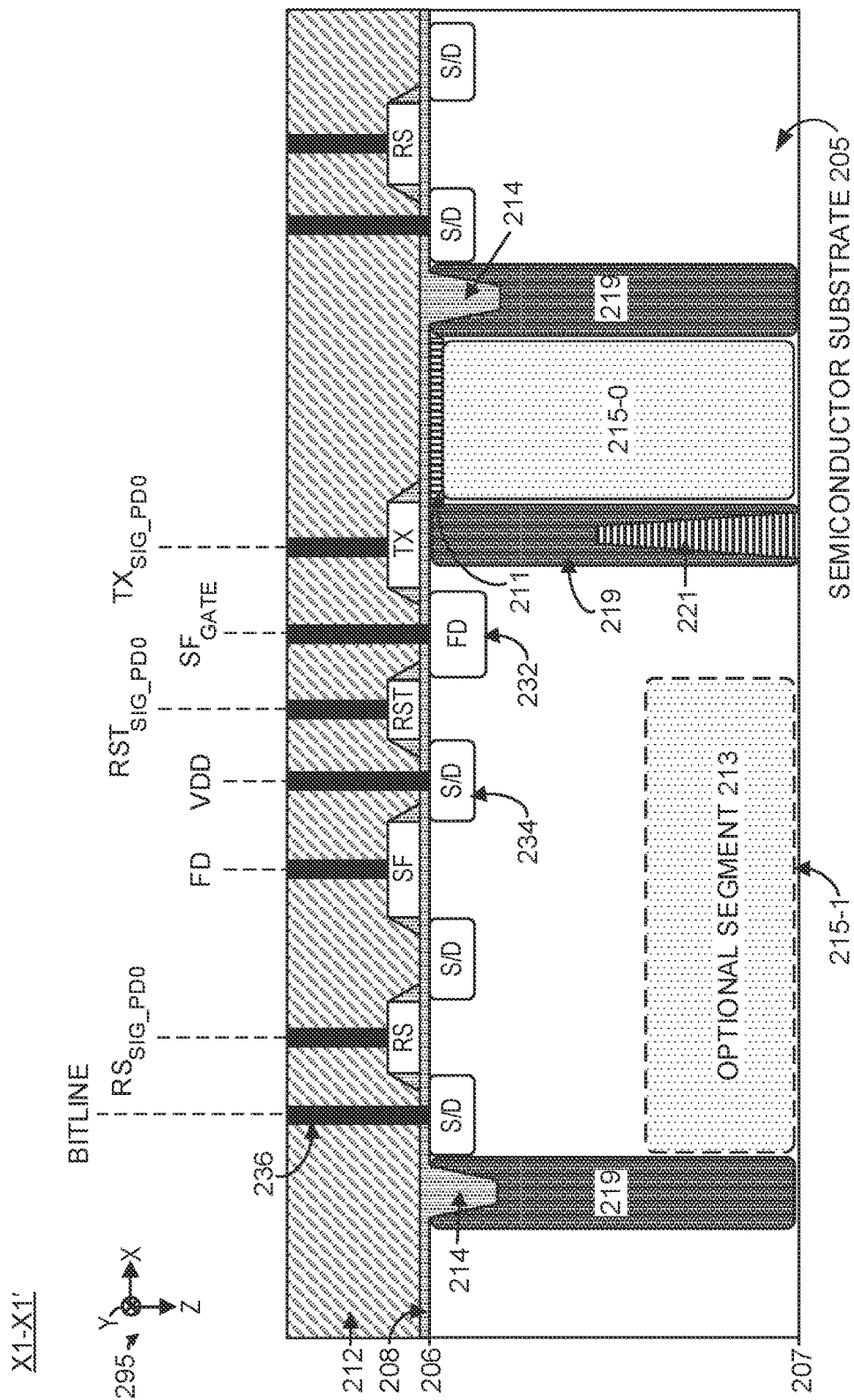
Figure 2D:
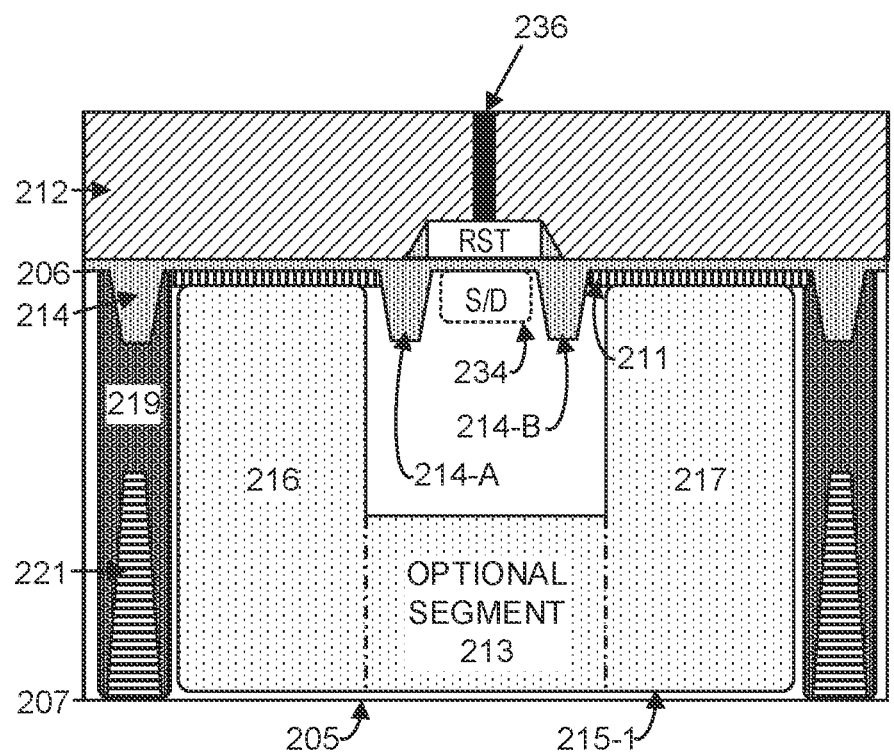

FIG. 2D illustrates a cross-sectional view along the line Y1-Y1' shown in FIG. 2B, in accordance with the teachings of the present disclosure.

Figure 2E:
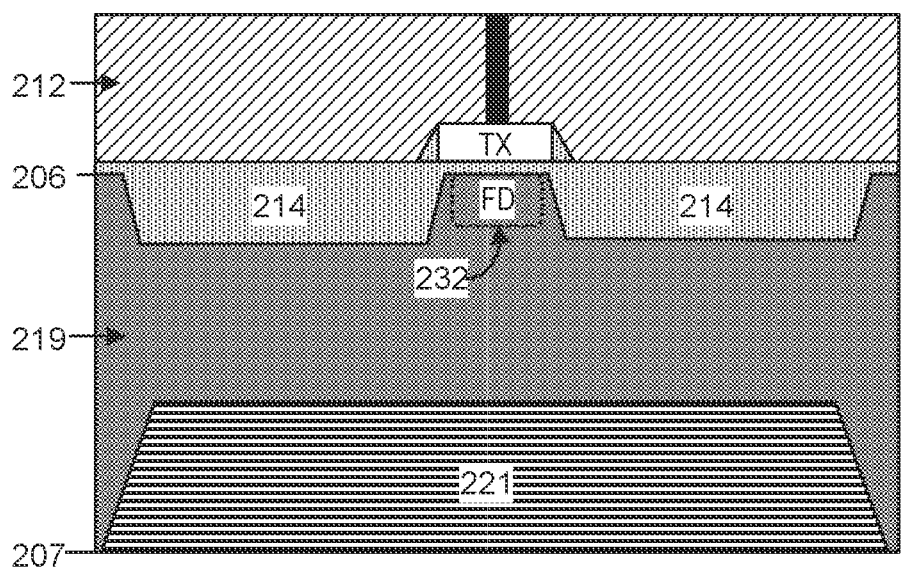

FIG. 2E illustrates a cross-sectional view along he line Y2-Y2' shown in FIG. 2B, in accordance with the teachings of the present disclosure.

Figure 2F:
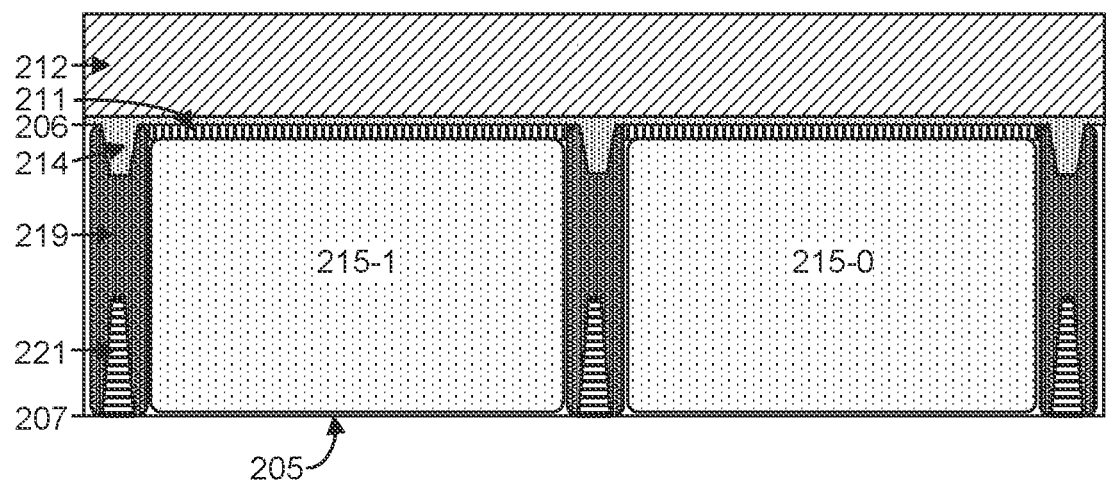

FIG. 2F illustrates a cross-sectional view along the line X2-X2' shown in FIG. 2B, in accordance with the teachings of the present disclosure.

Figure 2G:
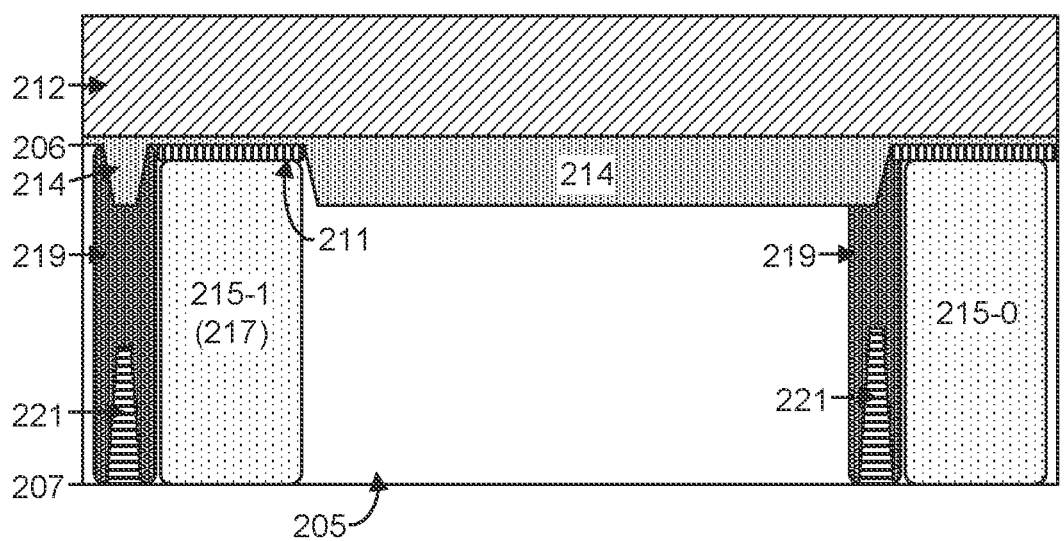

FIG. 2G illustrates a cross-sectional view along the line X3-X3' shown in FIG. 2B, in accordance with the teachings of the present disclosure.

Figure 3A:
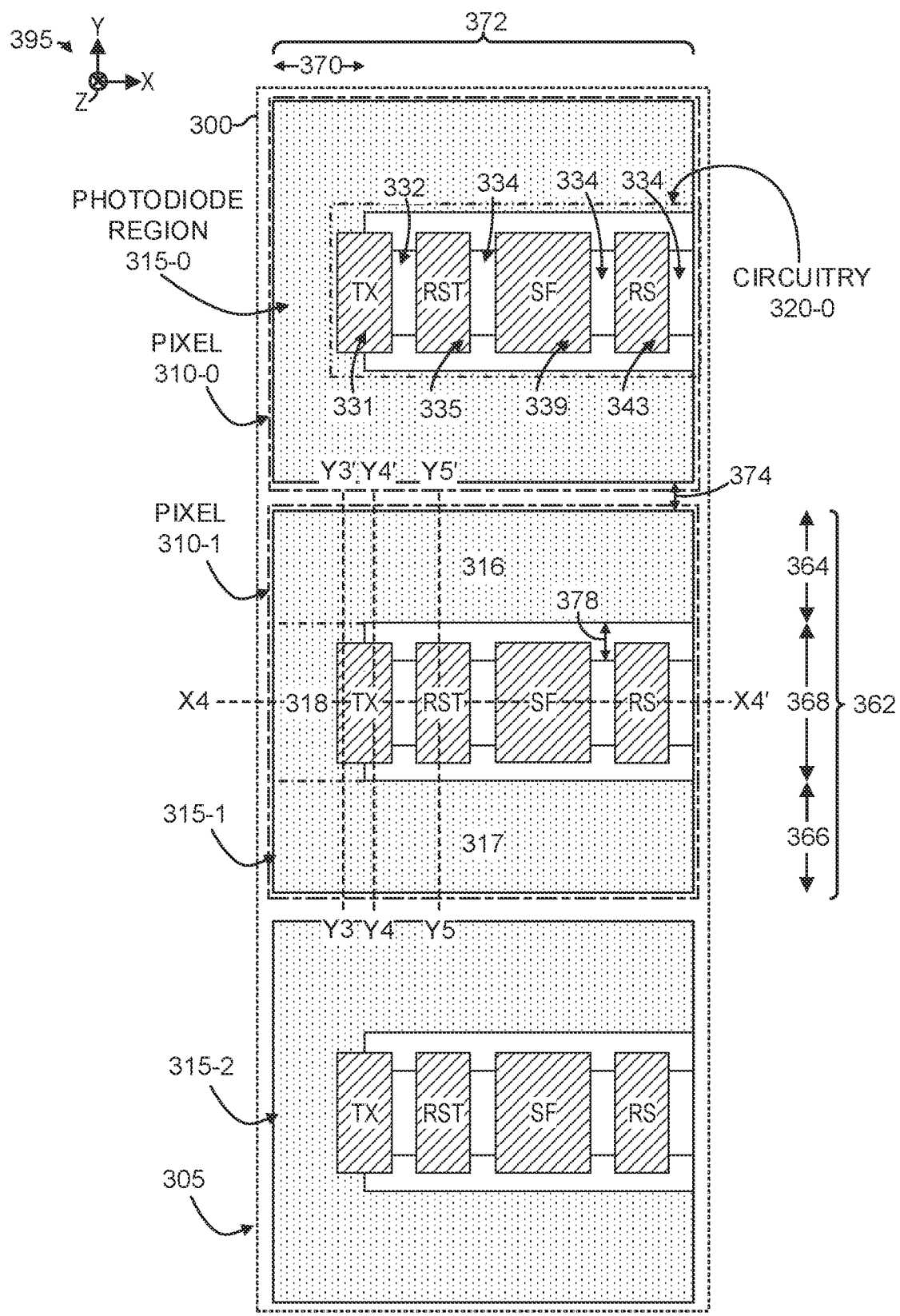

FIG. 3A illustrates a top view of an image sensor with a second example pixel layout including a. photodiode region that partially surrounds circuitry, in accordance with the teachings of the present disclosure.

Figure 3B:
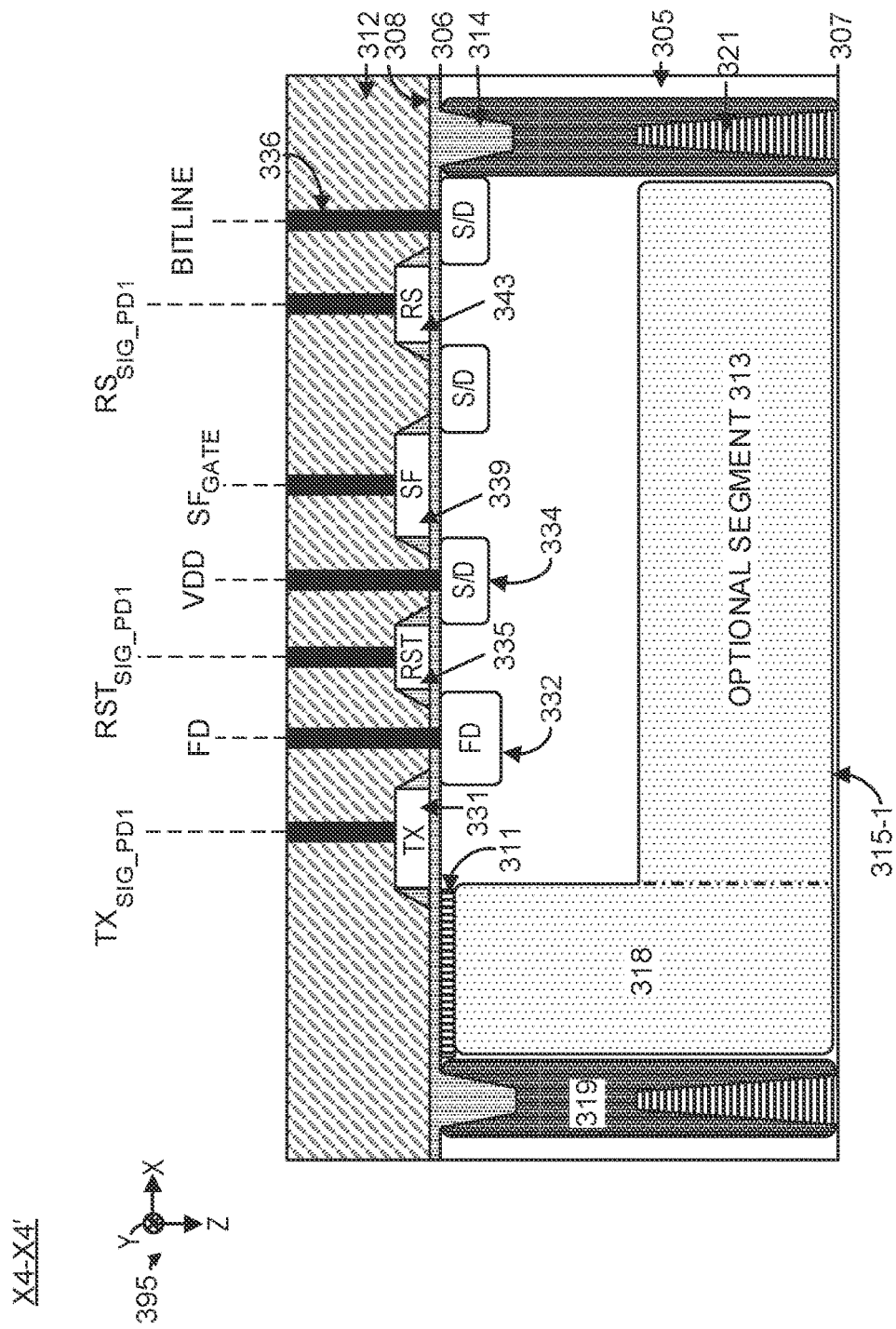

FIG. 3B illustrates a cross-sectional view along the line X4-X4' shown in FIG. 3A, in accordance with the teachings of the present disclosure.

FIG, 3C illustrates a cross-sectional view along the line Y3-Y3' shown in FIG. 3A, in accordance with the teachings of the present disclosure.

Figure 3C:
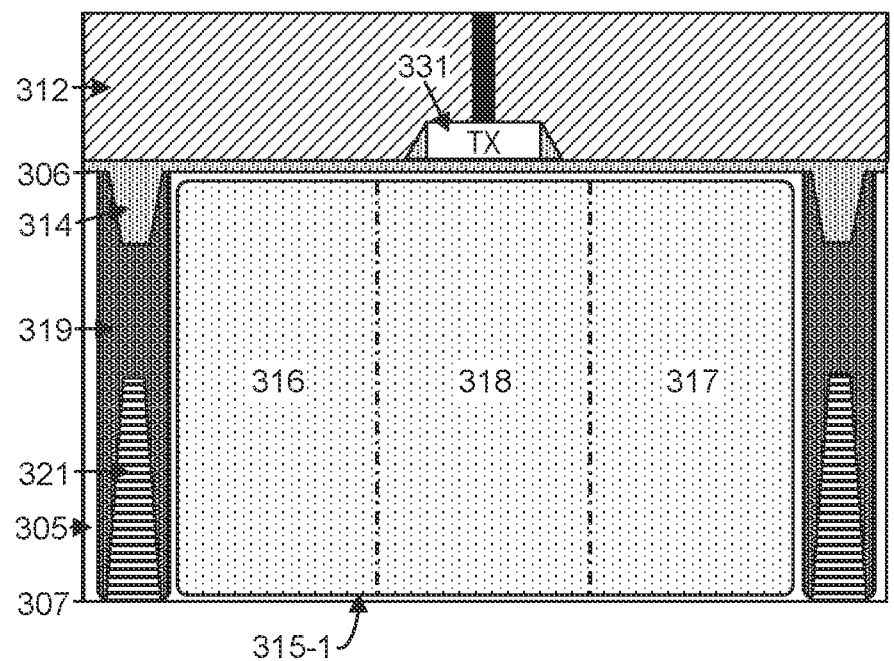
Figure 3D:
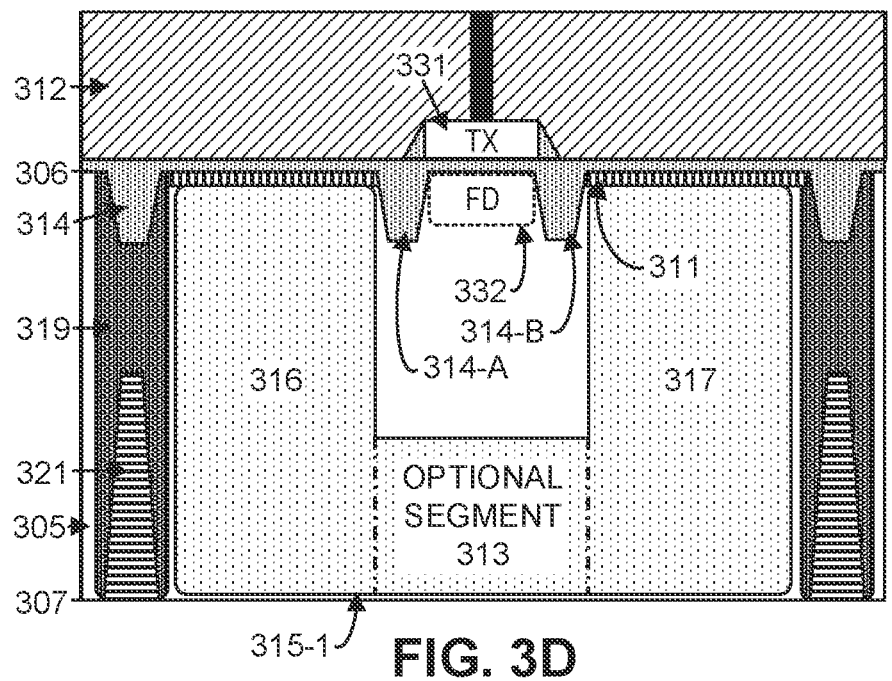

FIG. 3D illustrates a cross-sectional view along the line Y4-Y4' shown in FIG. 3A, in accordance with the teachings of the present disclosure.

Figure 3E:
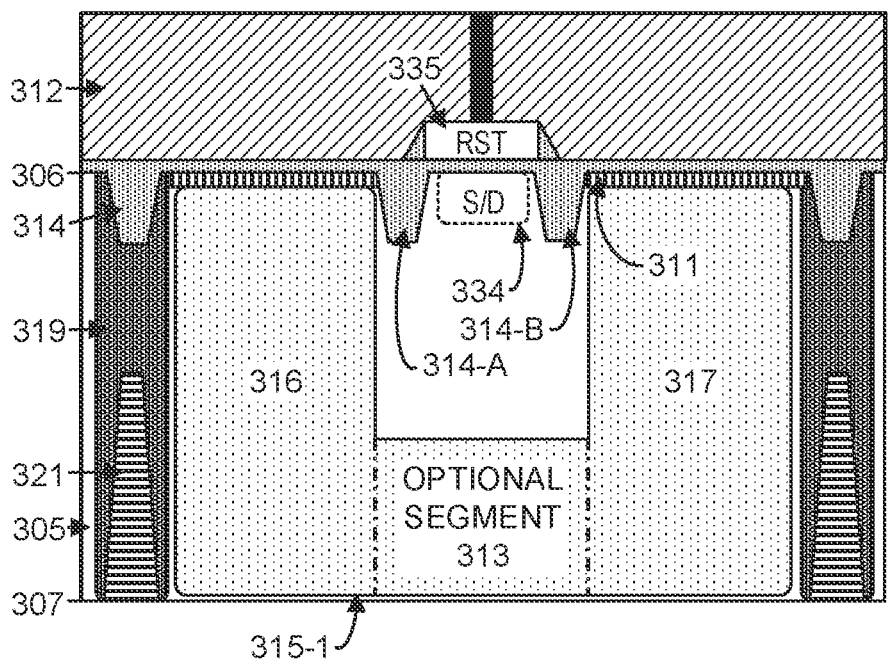

FIG. 3E illustrates a cross-sectional view along he line Y5-Y5' shown in FIG. 3A, in accordance with the teachings of the present disclosure.

DETAILED DESCRIPTION

Embodiments of an apparatus and system each including or otherwise related to an image sensor with a pixel layout including a photodiode region partially surrounding circuitry are disclosed here. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

One way of increasing full well capacity of a photodiode is to increase the physical size of the photodiode for each pixel of the image sensor, which may result in an increased dynamic range for the image sensor. Higher dynamic range image sensors are particularly advantageous in situations where the image sensor may be utilized in low light environments (e.g., security and automobile applications), but it is also appreciated that dynamic range is a fundamental performance characteristic of an image sensor and thus increased dynamic range is generally associated with improved performance. However, by increasing the physical size of the photodiodes, the pinning voltage (e.g., the voltage required to fully deplete a given photodiode) may increase, which can lead to image lag (e.g., information retained from a previous image frame due to one or more photodiodes not being fully depleted).

Described herein are embodiments that utilize an image sensor suitable for high dynamic range applications, but with photodiodes that have a reduced pinning voltage to mitigate the issue of image lag while still maintaining an efficient physical footprint to increase the number of pixels and/or photodiodes per unit area. This is achieved, at least in part, by having the pixel layout of the image sensor include individual photodiodes having a photodiode region that at least partially surround circuitry to increase space utilization efficiency. More specifically, rather than have a conventional rectangular cross-sectional shape, one or more photodiode regions of the embodiments described herein have a first cross-sectional shape that includes a first segment electrically coupled a second segment that forms an opening (e.g., a "U" shape, a "C" shape, an "O" shape, a "V"shape, a bracket shape, a donut shape, or any other shape in which the first and second segments collectively form the opening, which has dimensions sufficient to fit, at least in part, one or more circuitry components when the associated pixel is viewed from a side of the semiconductor substrate). By adjusting the shape of a photodiode region, circuitry may extend into the opening that would otherwise be placed between adjacent photodiode regions to enable efficient space utilization. In addition to increasing space efficiency, the shape of the photodiode regions described herein results in a reduced effective photodiode width, which consequently reduces pinning voltage of the associated pixel without a significant trade off in full well capacity.

It is appreciated that the term "photodiode region" may correspond to a region within the semiconductor substrate that has been doped, for example by ion implantation, to have an opposite charge carrier type (i.e., conductivity type) relative to the majority charge carrier type of the semiconductor substrate such that an outer perimeter of the doped region (e.g., herein referred to as a photodiode region) forms a PN junction or a PIN junction of a photodiode. For example, an N-doped region, formed in a P-type semiconductor substrate, forms a corresponding photodiode region. In some embodiments, a given pixel may further include a pinning region (e.g., a doped region disposed between a side of the semiconductor substrate and the photodiode region having a conductivity type opposite of the photodiode region conductivity type) to form a pinned photodiode. For example, the pinning region may have a P-type conductivity when the photodiode region is an N-type conductivity and the semiconductor substrate is also a P-type conductivity.

It is additionally appreciated that the term circuitry may include one or more transistors, including electrodes (e.g., a source region, a drain region, a gate electrode, or a floating diffusion) or other components (e.g., isolation structure such as a shallow trench isolation structure, a deep trench isolation structure, or the like), that may be surrounded, at least in part, by a photodiode region. The circuitry and photodiode regions may be formed within or otherwise disposed proximate to a semiconductor substrate (e.g., doped or undoped silicon substrate). In some embodiments, the circuitry may correspond to one or more elements of readout and/or control circuitry for a given pixel (e.g., components of 3T, 4T, or other pixel architecture that includes at least one of a transfer transistor, a reset transistor, a source-follower transistor, or a row-select transistor).

It is further appreciated that the term "at least partially surrounded" does not necessarily mean that the photodiode region fully encapsulates the circuitry. Rather, the term "at least partially surrounded" means that that one or more cross-sectional views, inclusive of the photodiode region and the circuitry, results in at least a portion of the circuitry disposed between segments of the photodiode region. For example, in one embodiment, a top view of the semiconductor substrate (e.g., when viewed from a front side or a back side of the image sensor) shows a gate electrode of a transistor included in the circuitry disposed, at least in part, between the segments of the photodiode region (see, e.g., FIG. 2B and/or FIG. 2D). However, it is noted that even though the photodiode region is disposed in the semiconductor substrate (e.g., the photodiode region is formed by doping a corresponding portion of the semiconductor substrate), the circuitry may be formed within the semiconductor substrate (e.g., in the case of a floating diffusion, source region and drain region of a transistor, or otherwise) or formed proximate to a side (e.g., the front side or back side) of the semiconductor substrate as shown in the various embodiments of the disclosure. In other words, components of the circuitry that are at least partially surrounded by a corresponding photodiode region may not necessarily be at the vertical position of the photodiode region (e.g., z-direction as shown in FIG. 2C). In some embodiments, a straight-line path and/or plane may extend through both a first segment of the photodiode region, a second segment of the photodiode region, and at least a portion of the circuitry (e.g., source/drain region, gate electrode, floating diffusion, or otherwise).

Figure 1:
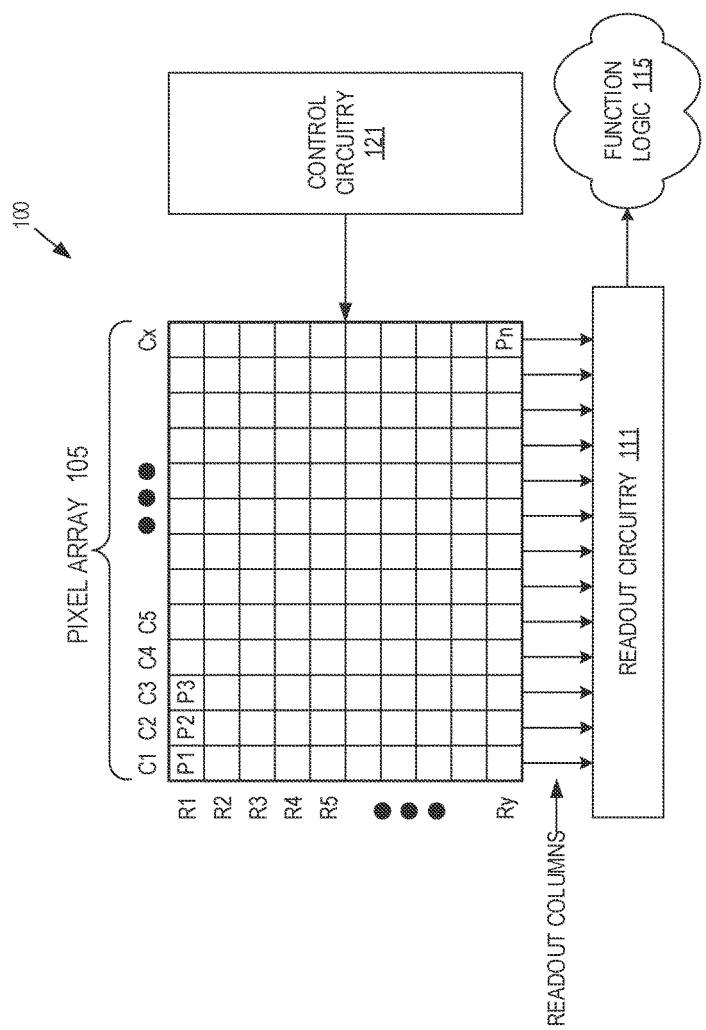
FIG. 1 illustrates an example block diagram of an imaging system including a pixel layout with photodiode region partially surrounding circuitry, in accordance with the teachings of the present disclosure.

FIG. 1 illustrates a block diagram of an imaging system 100, in accordance with an embodiment of the present disclosure. Imaging system 100 includes pixel array 105, control circuitry 121, readout circuitry 111, and function logic 115. In one embodiment, pixel array 105 is a two-dimensional (2D) array of photodiodes, or image sensor pixels (e.g., pixels P1, P2 ..., Pn). As illustrated, photodiodes are arranged into rows (e.g., rows R1 to Ry) and columns (e.g., column C1 to Cx) to acquire image data of a person, place, object, etc., which can then be used to render an image or video of the person, place, object, etc. However, photodiodes do not have to be arranged into rows and columns and may take other configurations.

In one embodiment, after each image sensor photodiode/pixel in pixel array 105 has acquired its image data or image charge, the image data is readout by readout circuitry 111 and then transferred to function logic 115. In various examples, readout circuitry 111 may include amplification circuitry, analog-to-digital (ADC) conversion circuitry, or otherwise. Function logic 115 may simply store the image data or even manipulate the image data by applying post image effects (e.g., autofocus, crop, rotate, remove red eye, adjust brightness, adjust contrast, or otherwise). In the same or another embodiment, readout circuitry 111 may readout a row of image data at a time along readout column lines (illustrated) or may readout the image data using a variety of other techniques (not illustrated), such as a serial readout or a full parallel readout of all pixels simultaneously. In one embodiment, control circuitry 121 is coupled to pixel array 105 to control operation of the plurality of image sensor pixels in pixel array 105. For example, control circuitry 121 may generate a shutter signal for controlling image acquisition. In some embodiments, control circuitry 121 may be configured to generate drive signals e.g., transfer signals (e.g., $TX_{SIG\_PD0}$, $TX_{SIG\_PD1}$), reset signals (e.g., $RST_{SIG\_PD0}$, $RST_{SIG\_PD1}$), and row-select signals ($RS_{SIG\_PD0}$, $RS_{SIG\_PD1}$) for controlling the operation of pixel circuitries associated with pixels in image sensor pixel array 105.

It is appreciated that imaging system 100 may be included in a digital camera, cell phone, laptop computer, automobile, or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

It is further appreciated that while the block diagram illustrated in FIG. 1 shows pixel array 105, readout circuitry 111, function logic 115, and control circuitry 121 as distinct and separate elements from the pixel array, this is not necessarily the case as such features may be combined or otherwise incorporated with the pixel array directly (e.g., within and/or between individual pixels, in the form of stacked substrates, or otherwise). For example, the readout circuitry 111 may include one or more transistors (e.g., associated with 3T, 4T, 5T, or other pixel architectures for reading out image charge from individual pixels), elements of which may be disposed between segments of individual photodiodes in accordance with embodiments of the present disclosure. Furthermore, the image sensor 100 may include features not explicitly illustrated or discussed but known by one of ordinary skill in the art such as color filters, microlenses, a metal grids, and the like. Additionally, it is appreciated that image sensor 100 is fabricable by conventional CMOS manufacturing techniques known by one of ordinary skill in the art, which may include, but is not limited to, photolithography, chemical vapor deposition, physical vapor deposition, ion implantation or diffusion, thermal oxidation, reactive ion etching, wet chemical etching, and the like.

FIGS. 2A-2G illustrate various views of an image sensor 200, in accordance with an embodiment of the disclosure. Image sensor 200 may be one possible implementation of imaging system 100 illustrated in FIG. 1. Referring back to FIGS. 2A-2G, image sensor 200 includes a plurality of photodiode regions 215 (e.g., 215-0, 215-1, 215-2, 215-3, 215-4, 215-5, 215-6, and 215-7) formed in a semiconductor substrate 205 (e.g., silicon) between a first side 206 (e.g., front side) and a second side 207 (e.g., back side) of the semiconductor substrate 205. Each of the plurality of photodiode regions 215 is coupled to associated circuitry 220 (e.g., circuitry 220-1 is coupled to first photodiode region 215-1) to form a plurality of pixels 210 (e.g., first pixel 210-1). Each of the plurality of photodiode regions 215 includes a first segment 216, a second segment 217, and an intermediate segment 218, which are coupled to a pinning layer 211. In some embodiments, each of the plurality of photodiode regions 215 further include an optional rectangular segment 213. Image sensor 200 further includes wells 219 having an opposite conductivity type to photodiode region 215 (e.g., a P-type well or an N-type well) and oxide filled (e.g., $SiO_2$) isolation structures (e.g., shallow trench isolation structures 214 and deep trench isolation structure 221) disposed within the semiconductor substrate 205, a dielectric layer 208, an interlayer dielectric 212, and a plurality of metal contacts 236. The circuitry 220 includes one or more electrodes (e.g., a transfer gate TX 231 of a transfer transistor, a reset gate RST 235 of a reset transistor, a source-follower gate SF 239 of a source-follower transistor, and a row-select gate RS 243 of a row-select transistor, source/drain regions 234 associated with the reset transistor, the source-follower transistor, and the row-select transistor, and a floating diffusion 232).

FIG. 2A illustrates a top view of an image sensor 200 with a first example pixel layout including a photodiode region that partially surrounds circuitry, in accordance with the teachings of the present disclosure. As illustrated, the top view of the image sensor 200 includes an array of nested pixels (e.g., image sensor pixels of FIG. 1) in which circuitry for a given pixel is at least partially surrounded by a photodiode region of an adjacent pixel. First pixel 210-1 includes first photodiode region 215-1 and circuitry 220-1. As shown, circuitry 220-1 extends into an opening formed by second photodiode region 215-2. In other words, the circuitry 220-1 of the first pixel 210-1 is partially surrounded by second photodiode region 21.5-2, which is associated with a second pixel. Similarly, the circuitry 220-2. that is coupled to second photodiode region 215-2 to form the second pixel that extends into the opening formed by third photodiode region 215-3, which is associated with a third pixel.

FIG. 2B illustrates a magnified view of the view shown in FIG. 2A, in accordance with the teachings of the present disclosure. The magnified view shows partial top views (e.g., when viewed from a first side of the semiconductor substrate 205) of different pixels (e.g., a pixel associated with the photodiode region 215-0 and the circuitry 220-0 including the transfer gate 231, the reset gate 235, the source-follower gate 239, and the row-select gate 243, a pixel associated with the first photodiode region 215-1, a pixel associated with the photodiode region 215-4, and a pixel associated with the photodiode region 215-5).

As illustrated in FIG. 2B, the first photodiode region 215-1 includes a first segment 216, a second segment 217, and an intermediate segment 218 to form a photo-sensing region of a first pixel (e.g., pixel 210-1 illustrated in FIG. 2A) that accumulates photo-generated electrons in response to incident light. The first segment 216 is coupled to the second segment 217 via the intermediate segment 218. It is appreciated that the first photodiode region 215-1 formed by the first segment 216, the second segment 217, and the intermediate segment 218 is a monolithic unit that has been sectioned for ease of description. The first segment 216 and the second segment 217 extend laterally along a first direction (e.g., x-direction in accordance with a coordinate system 295) and the intermediate segment 218 extends laterally along a second direction (e.g., y-direction in accordance with the coordinate system 295). As illustrated, the first direction is substantially orthogonal to the second direction, such that the first photodiode region 215-1 forms a substantially rectangular cross-sectional opening sufficient in dimension such that circuitry (e.g., circuitry 220-0 that is electrically coupled to photodiode region 215-0) is disposed, at least in part, within the opening between the first segment 216 and the second segment 217 (e.g., transfer gate 231, reset gate 235, source-follower gate 239, row-select gate 243, any source/drain region of a transistor such as a reset transistor, a source-follower transistor, and a row-select transistor, or otherwise). However, it should be appreciated that in other embodiments, the first segment 216 and the second segment 217 may not necessarily be parallel with one another and/or orthogonal with respect to the intermediate segment 218. Accordingly, in other embodiments, the first photodiode region 215-1 may have a cross-sectional shape corresponding to at least one of a "U" shape, a "C" shape, an "O" shape, a "V" shape, a bracket shape, a donut shape, or any other shape in which the first and second segments collectively form an opening with dimensions sufficient to fit, at least in part, one or more circuitry components when the associated pixel is viewed from a side of the semiconductor substrate.

In the illustrated embodiment, the first segment 216 and the second segment 217 respectively have a first length and a second length (e.g., length 272 since the first segment 216 and the second segment 217 have a substantially equal lengths), each taken along the first direction (e.g., x-direction of coordinate system 295). The intermediate segment 218 has a first width 270 taken along the first direction. The first width 270 of the intermediate segment 218 is less than the length 272 of at least one of the first segment 216 or the second segment 217. Additionally, a separation distance 268 between the first segment 216 and the second segment 217 is greater than or equal to a corresponding width (e.g., 264 or 266) of the first segment 216 or the second segment 217 taken along the second direction (e.g., y-direction of the coordinate system 295). Furthermore, the corresponding widths (e.g., 264, 266) of the first segment 216 and the second segment 217 taken along the second direction are substantially equal to one another. In the illustrated embodiment, at least one of the corresponding widths (e.g., 264, 266) of the first segment 216 or the second segment 217 is less than the separation distance 268 between the first segment 216 and the second segment 217 of the first photodiode region 215-1.

It is appreciated that the full well capacity and pinning voltage associated with the first photodiode region 215-1 is based, at least in part, on the shape and dimensions of the first segment 216, the second segment 217, and the intermediate segment 218. Thus, in some embodiments, the shape of the first photodiode region 215-1 may be adjusted to obtain target parameters. In some embodiments, the length 272 of the first segment 216 and/or the second segment 217 is approximately 2 µm to 3.5 µm and the widths (e.g., 264, 266) is approximately 1-1.5 µm. In some embodiments, the length 272 of the first segment 216 and/or second segment 217 is approximately twice the size of the width (e.g., 264, 266). For example, in one embodiment, each of the widths 264 and 266 are approximately 1.25 µm, and the length 272 is approximately 2.5 µm. In the same or other embodiments, the separation distance 268 is approximately 400 nm to 1.5 µm. In one or more embodiments, the width 262 of the first photodiode region 215-1 is approximately 2.4 µm to 4 µm. In some embodiments, the separation distance 268 is not greater than one third of the width 262 of the first photodiode region 215-1. In general, it is appreciated that in most embodiments the width 262 of the first photodiode region 215-1 is greater than the separation distance 268, which is greater than an isolation distance 278. The isolation distance 278 corresponds to a distance between the source/drain regions of transistors of circuitry 220-0 associated with adjacent photodiode region (e.g. 215-0) and the first segment 216 of first photodiode region 215-1 or between the source/drain regions of transistors of circuitry 220-0 and the second segment 217 of first photodiode region 215-1. In some embodiments the isolation distance 278 is at least 100 nm to provide sufficient isolation. In some embodiments the isolation distance 278 ranges from 100 nm to 300 nm. In the same or other embodiments, the isolation distance 278 is approximately equal to a pixel separation distance 274. The pixel separation distance 274 corresponds to the distance between adjacent photodiode regions (e.g., the distance between first photodiode region 215-1 and photodiode region 215-5 or the distance between the first photodiode region 215-1 and photodiode region 215-0). In some embodiments, the separation distance 268 between the first segment 216 and the second segment 217 is greater than the pixel separation distance 274.

As illustrated in FIG, 2B, circuitry of a given pixel is at least partially surrounded by the photodiode region of an adjacent pixel (e.g., the circuitry 220-0 associated with photodiode region 215-0 is disposed, at least in part, between the first segment 216 and the second segment 217 of the first photodiode region 215-1). In accordance with embodiments of the disclosure, the circuitry may one or more electrodes such as the transfer gate 231 of a transfer transistor, a reset gate 235 of a reset transistor, a source-follower gate 239 of a source-follower transistor, a row-select gate 243 of a row-select transistor, the associated source/drain regions 234 (see, e.g., FIG. 2C and FIG. 2D) of the transfer transistor, reset transistor, the source-follower transistor, or the row-select transistor, the floating diffusion 232 (see, e.g., FIG. 2C and FIG. 2E), or otherwise that may each be disposed between the first segment 216 and the second segment 217 of the first photodiode region 215-1. More generally, circuitry associated with a first transistor (e.g., transfer, reset, source-follower, row-select, or otherwise) includes at least a first electrode (e.g., 231, 235, 239, 243, 234, 232) associated with a first transistor. The first electrode is disposed, at least in part, between the first segment 216 and the second segment 217 such that the circuitry is at least partially surrounded by the first photodiode region 215-1 when viewed from the first side (e.g., front side 206) of the semiconductor substrate 205.

In some embodiments, the circuitry includes the transfer gate 231 of the transfer transistor, which couples the adjacent photodiode region (e.g., 215-0 with respect to 215-1) to a respective floating diffusion (e.g., the floating diffusion 232 illustrated in FIG. 2C) for controlling charge transfer between the adjacent photodiode region 215-0 and the floating diffusion 232. The floating diffusion 232 is disposed, at least in part, between the first segment 216 and the second segment 217 of the first photodiode region 215-1.

In one embodiment, the transfer gate 231 is disposed, at least in part, between the first segment 216 and the second segment 217 of the first photodiode region 215-1. However, in other embodiments, the first photodiode region 215-1 is separated from the adjacent photodiode region (e.g., 215-0) to such an extent that the transfer gate (e.g., 231) is not disposed between the first segment 216 and the second segment 217 of the first photodiode region 215-1. For example, as illustrated in FIG. 2A, the transfer gate 231-6, electrically coupled to photodiode region 215-6, is not disposed between the opening formed by the photodiode region 215-7. More specifically, in some embodiments, the transfer gate 231-6 has a longitudinal length (e.g., length in the Y direction of the coordinate system 295 illustrated in FIG. 2B) greater than the separation distance between the first segment and the second segment of the nested photodiode region such that the transfer gate 231-6 is disposed, at least in part, between the first segment of the photodiode region 215-7 and the adjacent photodiode region 215-6. It is further appreciated that in some embodiments, the transfer gate 231 may have different shapes (e.g., transfer gate 231-5, electrically coupled to photodiode region 215-5, has a trapezoidal cross-sectional shape, to enable greater overlap with the photodiode region 215-5 while also providing sufficient space for electrical isolation of the transfer gate 231-5 from the photodiode region 215-6).

It is appreciated that the pixel layout of FIG. 2B is space efficient such that the respective photodiode regions 215 at least partially surround the circuitry (e.g., readout circuitry) of an adjacent photodiode region. This allows for the pixel layout to have closer packed photodiode regions without a need for circuitry to be disposed in the region defined by the pixel separation distance 274. For example, the illustrated embodiment shows two adjacent photodiode regions (e.g., 215-0 and 215-5) with respect to the first photodiode region 215-1 that are each disposed proximate to the first side of the semiconductor substrate 205 to respectively form adjacent pixels that are both laterally adjacent to the first pixel 210-1. While only partially illustrated in FIG. 2B, but as shown in FIG. 2A, the two adjacent photodiode regions have a same shape as the first photodiode region 215-1. Furthermore, the two adjacent photodiode regions (e.g., 215-0 and 215-5) are disposed diagonally from one another. As shown in FIG. 2G, an isolation structure (e.g., containing the shallow trench isolation 214, the deep trench isolation structure 221, and the well 219) is disposed between the second segment 217 of the first photodiode region 215-1 and one of the two adjacent photodiode regions (e.g., 215-0). In some embodiments, the deep trench isolation structure 221 is disposed between photodiode regions of adjacent pixels to provide isolation therebetween. In the same or other embodiments, the deep trench isolation structure 221 is arranged in a grid form to isolate photodiode regions of nested pixels. Moreover, in one or more of the embodiments of the disclosure, there are no transistors disposed between the second segment 217 of the first photodiode region 215-1 and at least one of the two adjacent photodiode regions e.g., 215-5 or 215-0).

FIG. 2C illustrates a cross-sectional view along the line X1-X1' shown in FIG. 2B, in accordance with the teachings of the present disclosure. As illustrated, the photodiode region 215-0 (which is also representative in terms of structure to photodiode region 215-1 illustrated in FIG. 2B) is disposed within the semiconductor substrate 205 proximate to the first side 206 (e.g., front side) of the semiconductor substrate 205 to form a pixel. in the illustrated embodiments, each of the photodiode regions are pinned photodiodes and include a pinning region 211 disposed between the individual photodiode regions 215 and the first side 206 of the semiconductor substrate 205. It is appreciated, that in some embodiments, the pinning region 211 has a substantially equal cross-sectional shape to the shape of an associated photodiode region (e.g., the pinning region 211 associated with the photodiode region 215-0 has a substantially equal cross-sectional area).

In the illustrated embodiment of FIG. 2C, the floating diffusion 232, the source/drain regions 234, the shallow trench isolation structures 214, the metal contacts 236, and the gate electrodes (e.g., TX corresponding to transfer gate 231, RST corresponding to reset gate 235, SF corresponding to source-follower gate 239, and RS corresponding to row-select gate 243), isolation structures 214 and wells 219 are each disposed between the first segment 216 and the second segment 217 of the first photodiode region 215-1 when viewed from the first side 206 of the semiconductor substrate 205 (e.g., as shown in FIG. 2B or when FIG. 2C is viewed in context of FIG. 2B). In the illustrated embodiment, the dielectric layer 208 is formed of an oxide (e.g., $SiO_2$) and disposed on the semiconductor substrate 205 proximate to the first side 206 of the semiconductor substrate 205. Similarly, the interlayer dielectric 212 is disposed proximate to the first side 206 of the semiconductor substrate 205 (e.g., such that the dielectric layer 208 is disposed between the interlayer dielectric 212 and the semiconductor substrate 205) and encapsulates, at least in part, metal contacts 236, gate electrodes (e.g., the transfer gate 231, the rest gate 235, the source-follower gate 239, or the row-select gate 243 illustrated in FIG. 2B), or otherwise.

In some embodiments, the first photodiode region 215-1 further includes an optional rectangular segment 213 coupled to the first segment 216, the second segment 217, and the intermediate segment 218 (see, e.g., FIG. 2D). The rectangular segment 213 is optional, but when utilized provides increased full well capacity of the first photodiode region 215-1. Accordingly, when the first photodiode region 215-1 is viewed in context of FIG. 2A, FIG. 2B, FIG. 2C, and FIG. 2D, one will appreciate that in some embodiments the first photodiode region 215-1 includes an upper portion (e.g., defined by the first segment 216, the second segment 217, and the intermediate segment 218) with a "U" shape, a "C" shape, or other shape that forms an opening, and a lower portion (e.g., defined by the intermediate segment 218 and the rectangular segment 213) that has a rectangular shape. In the illustrated embodiment, the optional rectangular segment 213 is of a rectangular shape, however, it is appreciated that in some embodiments, optional rectangular segment 213 may be of any other suitable polygonal shape, such as square. Accordingly, in one embodiment, the upper portion of the first photodiode region 215-1 has a first cross-section (e.g., as illustrated in FIG. 2B) proximate to the first side 206 of the semiconductor substrate 205 that forms a shape with an opening (e.g., region between the first segment 216 and the second segment 217 defined by the separation distance 268). In the same or another embodiment, the lower portion of the first photodiode region 215-1 has a second cross-section proximate to the second side 207 of the semiconductor substrate with a rectangular shape (e.g., defined by the width 262 and the length 272 of the photodiode region 215-1 illustrated in FIG. 2B). In such an embodiment, at least a part of circuitry may be formed above a part of first photodiode region 215-1 (e.g., above the segment 213 of first photodiode region 215-1). In one example, at least one transistor (e.g., source follower transistor, reset transistor and/or row select transistor) that is associated with (or coupled to) an adjacent photodiode region (e.g., photodiode region 215-0) is formed above the optional rectangular segment 213 of the first photodiode region 215-1. Alternatively, at least a part of circuitry 220 that is associated with (or coupled to) an adjacent photodiode region (e.g., photodiode region 215-0) vertically overlaps with the optional rectangular segment 213 of the first photodiode region 215-1.

Referring back to FIG. 2C, the plurality of metal contacts 236 disposed in the interlayer dielectric 212 connect to various components of the circuitry (e.g., for a 4T pixel architecture as illustrated or otherwise) to metallization layers or metal interconnection layers (not illustrated for simplicity) formed above interlayer dielectric 212. More specifically, when viewed in context of FIG. 2B, the transfer gate 231 couples the photodiode region 215-0 to the respective floating diffusion 232 for selectively transferring image charge (e.g., photogenerated charge) from the photodiode region 215-0 to the floating diffusion 232 based on a transfer signal ($TX_{SIG\_PD0}$) received at the transfer gate 231 through respective metal contact 236. Drains of the reset transistor (RST) and source-follower transistor (SF) are coupled to a power supply voltage through respective metal contacts 236 and metallization layers. The reset transistor (RS) selectively resets the floating diffusion 234 and the photodiode region 215-0 coupled to a predetermined voltage in response to a reset signal ($RST_{SIG\_PD0}$). The floating diffusion 232. is coupled to a source of the reset transistor and the source-follower gate 239 of the source-follower transistor through respective metal contacts 236 and metallization layers as illustrated. The source-follower transistor is coupled to modulate an image signal based on the voltage of floating diffusion 232. The image signal corresponds to the amount of photoelectrons accumulated in the photodiode region 215-0 during an integration period, transferred to floating diffusion 232 during a charge transfer period, and outputted by floating diffusion 232 to the source-follower gate 239. The row-select transistor selectively couples the output (e.g., the image signal) of source-follower transistor to the bitline through corresponding metal contact 236 and metallization layers under control of a row select signal $RS_{SIG\_PD0}$. It is appreciated that the example pixel control architecture may also be utilized for other pixels within the image sensor 200. It is further appreciated that the illustrated pixel circuitry architecture is just one example and that other pixel control architecture known in the art may also be utilized.

FIG. 2D illustrates a cross-sectional view along the line Y1-Y1' shown in FIG. 2B, in accordance with the teachings of the present disclosure. While FIG. 2D illustrates a view in relation to reset gate 235 illustrated in FIG. 2B, the view shown in FIG. 2D is similarly representative for the source-follower gate 239 and the row-select gate 243. Referring back to FIG. 2D, the reset gate (e.g., RST 235), the source/drain region 234, and the shallow trench isolation (STI) structure 214 are each disposed between the first segment 216 and the second segment 217 of the photodiode region 215-1. In some exemplary embodiment, the first photodiode region 215-1 further includes optional rectangular segment 213, which is coupled to the first segment 216 and the second segment 217 such that the circuitry (e.g., source/drain region 234, STI structures 214-A and 214-B, or otherwise) are partially encapsulated by the first photodiode region 215-1. In such an embodiment, at least part of reset transistor that is associated with (or coupled to) adjacent photodiode region of adjacent pixel (e.g., photodiode region 215-0) are formed above at least a part of first photodiode region 215-1 (e.g., above the segment 213 of first photodiode region 215-1). More generally, the source/drain region 234 and/or the reset gate may be considered a first electrode included in the circuitry.

It is appreciated that in the illustrated embodiment the source/drain region 234 is not directly viewable in the view of cross-section Y1-Y1' shown in FIG. 2D. Rather, the source/drain region 234, denoted with a dashed line, is provided for the sake of positional clarity (e.g., to show the source/drain region 234 is disposed between the first segment 216 and the second segment 217) and thus it should be appreciated is not positioned directly under and aligned with the reset gate 235 (e.g., gate labeled "RST" corresponding to the reset gate 235 illustrated in FIG. 2B), More specifically, the source/drain region 234 is disposed deeper into the page of FIG. 2D) (e.g., X-direction of the coordinate system 295 illustrated in FIG. 2B). The STI structure 214-A corresponds to a first STI structure and the STI structure 214-B corresponds to a second STI structure. As illustrated, the first electrode (e.g., source/drain region 234 and/or the reset gate 235) is disposed between the first STI structure 214-A and the second STI structure 214-B. The first STI structure 214-A is disposed between the first segment 216 of the first photodiode region 215-1 and the first electrode. The second STI structure 2145-B is disposed between the first electrode and the second segment 217 of the first photodiode region 215-1. In some embodiments, the first photodiode region 215-1 is at least partially surrounded by an isolation structure including a well 219 (e.g., a P-well), a deep trench isolation (DTI) structure 221 disposed in the well 219 proximate to the second side 207 (e.g., back side) and a STI structure 214 disposed in the well 219 proximate to the first side 206 (e.g., front side).

In some embodiments, the first STI structure 214-A and the second STI structure 214-B each extends a depth from the first side 206 into the semiconductor substrate 205 that is greater than a. junction depth of the source/drain region 234 of a transistor. It is appreciated that the junction depth of the source/drain region 234 corresponds to the depth that the source/drain region 234 extends into the semiconductor substrate 205 from the first side 206 In other words, the first STI structure 214-A and the second STI structure 214-B extend further into the semiconductor substrate 205 from the first side 206 than the source/drain region 234 to provide electrical isolation between the circuitry (e.g., source/drain region 234 or otherwise) and both the first segment 216 and the second segment 217 of the first photodiode region 215-1. It is appreciated that the illustrated embodiment shows the DTI structure 221 vertically aligned with a respective STI structure 214 to collectively provide electrical isolation between adjacent photodiode regions and/or pixels. For example, a vertically aligned pair of STI structures 214 and DTI 221 structures may be disposed between second photodiode region 215-2 and photodiode region 215-6 illustrated in FIG. 2A to provide electrical isolation between said photodiode regions.

Referring back to FIG. 2D, in some embodiments, the source/drain region 234, the first STI structure 214-A, and the second STI structure 214-B are disposed in an additional implanted well (e.g., an unillustrated P-well that is disposed between the first segment 216 and the second segment 217 of the first photodiode region 215-1). In the same or other embodiments, the additional implanted well, well 219, and the pinning layer 211 are each electrically coupled to a ground or reference voltage.

FIG. 2E illustrates a cross-sectional view along the line Y2-Y2' shown in FIG. 2B, in accordance with the teachings of the present disclosure. As illustrated, the STI structure 214 is extends, at least in part, between adjacent photodiode regions (e.g., between photodiode regions 215-0 and 215-1 illustrated in FIG. 2B). Further still, the transfer gate (e.g., TX, which corresponds to transfer gate 231 illustrated in FIG. 2B) is coupled to the floating diffusion 232, which is not directly necessarily directly under the transfer gate, but rather is disposed deeper into the page (e.g., X-direction of the coordinate system 295 illustrated in FIG. 2B). As illustrated, the STI structure 214 and the DTI structure 221 are disposed within well 219 (e.g., a P-doped region of the semiconductor substrate 205), which collectively provide isolation between adjacent photodiode regions. It is appreciated that in the illustrated embodiment the floating diffusion 232 may not be directly viewable in the view of cross-section Y2-Y2' shown in FIG. 2E. Rather, the floating diffusion 232, denoted with a dashed line, is provided for the sake of positional clarity.

FIG. 2F illustrates a cross-sectional view along the line X2-X2' shown in FIG. 2B, in accordance with the teachings of the present disclosure. As illustrated, adjacent photodiode regions (e.g., 215-1 and 215-0) are electrically isolated from one another, at least in part, by an isolation structure that includes a well 219 (e.g., P-type doped well when the photodiode regions 215-1 and/or 215-0 corresponds to an N-doped region), an STI structure 214 disposed within the well 219 proximate to the first side 206 of the semiconductor substrate 205 and a DTI structure 221 disposed within the well 219 proximate to the second side 207. It is further appreciated that the STI structure 214 and the DTI structure 221 may be formed of oxide (e.g., SiO$_2$) filled trench structure.

FIG. 2G illustrates a cross-sectional view along the line X3-X3' shown in FIG. 2B, in accordance with the teachings of the present disclosure. The illustrated embodiment shows that STI structure 214 isolates the circuitry from the respective photodiode region 215 surrounding the circuitry (e.g., the circuitry 220-2 is isolated, at least in part, from the photodiode region 215-3 illustrated in FIG. 2A by a respective STI structure 214).

FIGS. 3A-3E illustrate various views of an image sensor 300, in accordance with an embodiment of the disclosure. Image sensor 300 may be one possible implementation of imaging system 100 illustrated in FIG. 1. It is further appreciated that image sensor 300 may include features similar or identical to image sensor 200 illustrated in FIGS. 2A-2G. Referring back to FIGS. 3A-3E, image sensor 300 includes a plurality of photodiode regions 315 (e.g., 315-0, 315-1, and 315-2) formed in a semiconductor substrate 305 (e.g., silicon) between a first side 306 (e.g., front side) and a second side 307 (e.g., back side) of the semiconductor substrate 305. Each of the plurality of photodiode regions 315 is electrically coupled to associated circuitry 320 (e.g., circuitry 320-0 is coupled to photodiode region 315-0) to form a plurality of pixels 310 (e.g., pixel 310-0). Each of the plurality of photodiode regions 315 includes a first segment 316, a second segment 317, and an intermediate segment 318, which are coupled to a pinning layer 311. Image sensor 300 further includes wells 319 (e.g., a P-type well or an N-type well) and oxide filled (e.g., SiO$_2$) isolation structures (e.g., shallow trench isolation structures 314 and deep trench isolation structure 321) disposed within the semiconductor substrate 305, a dielectric layer 308 deposited on the semiconductor substrate 305, an interlayer dielectric 312 deposited on the dielectric layer 308, and a plurality of metal contacts 336 disposed in the interlayer dielectric 312 connecting the elements of circuitry 320 to one or more metallization layers (not illustrated). It is appreciated that in some embodiments, a vertically aligned pair of the shallow trench isolation structures 314 and deep trench isolation structure 321 are disposed within one of the wells 319 to form an isolation structure. In the isolation structure, the well 319 extends from the first side 306 of the semiconductor substrate 305 towards the second side 306 of the semiconductor substrate. The STI structure 314 is disposed within the well 319 proximate to the first side 306 and the DTI structure 321 is disposed within the well 319 proximate to the second side 307. In another embodiment, the shallow trench isolation structures 314 extend to a first well region from front side 306 and the deep trench isolation structure 321 extends to a second well region from backside 307, where the first well region and second well region are vertically aligned and connected. In said embodiment, the first well region and second well region may be formed with different implantation energy or different implantation process. The circuitry 320 includes one or more electrodes (e.g., a transfer gate 331 of a transfer transistor, a reset gate 335 of a reset transistor, a source-follower gate 339 of a source-follower transistor, and a row-select gate 343 of a row-select transistor, source/drain regions 334 associated with the reset transistor, the source-follower transistor, and the row-select transistor, and a floating diffusion 332).

The pixel layout of image sensor 300 illustrated in FIGS. 3A-3E is similar to the pixel layout of image sensor 200 illustrated in FIGS. 2A-2G in many regards and includes like-labeled elements. One difference is that for image sensor 200, circuity (e.g., circuitry 220-2 illustrated in FIG. 2A) that is at least partially surrounded by a photodiode region (e.g., third photodiode region 215-3 illustrated in FIG. 2A) is for readout of an adjacent photodiode region (e.g., second photodiode region 215-2 illustrated in FIG. 2A). In contrast, for image sensor 300 circuitry (e.g., circuitry 320-0 illustrated in FIG. 3A) that is at least partially surrounded by a photodiode region (e.g., photodiode region 315-0 illustrated in FIG. 3A) is for readout of the same photodiode region that at least partially surrounds the circuitry (e.g., circuitry 320-0 is for reading out image charge from photodiode region 315-0 in the pixel 310-0 as illustrated in FIG. 3A).

FIG. 3A illustrates a top view of the image sensor 300 with a second example pixel layout including a photodiode region that partially surrounds the associated circuitry, in accordance with the teachings of the present disclosure. As illustrated, the image sensor 300 includes a two-dimension array of pixels 310 (e.g., pixel 310-1), with each of the photodiode regions 315 at least partially surrounding circuitry (e.g., circuitry 320-0 is partially surrounded by photodiode region 315-0). As illustrated, each of the photodiode regions 315 have a substantially equal cross-sectional shape. For example, photodiode region or first photodiode region 315-1 includes the first segment 316, the second segment 317, and the intermediate segment 318 which couples the first segment 316 to the second segment 317. It is appreciated that the photodiode regions 315 may have a similar segment dimensionality and positional relationship with respect to the various components of the circuitry 320 (e.g., the transfer gate 331, the reset gate 335, the source-follower gate 339, the row-select gate 343, the source/drain regions 334, the floating diffusion 332, and the like) and the coordinate system 395 in a manner similar to like-labeled elements described in relation to the image sensor 200 illustrated in FIGS. 2A-2G, in accordance with embodiments of the disclosure.

As illustrated, the first photodiode region 315-1 includes the first segment 316, the second segment 317, the intermediate segment 318. In some embodiments, the first photodiode region 315-1 further includes an optional rectangular segment 313 (see, e.g., FIG. 3B, 3D, and 3E). The first photodiode region 315-1 has a width 362 and a length 372. The first segment 316 and the second segment 317 respectively have a first length and a second length (e.g., length 372 since the first segment 316 and the second segment 317 illustrated have a substantially equal lengths), each taken along the first direction (e.g., x-direction of coordinate system 395). The intermediate segment 318 has a first width 370 taken along the first direction. The first width 370 of the intermediate segment 318 is less than the length 372 of at least one of the first segment 316 or the second segment 317 along the first direction. Additionally, a separation distance 368 between the first segment 316 and the second segment 317 is greater than or equal to a corresponding width (e.g., 364 or 366) of the first segment 316 or the second segment 317 taken along the second direction (e.g., y-direction of the coordinate system 395). Furthermore, the corresponding widths (e.g., 364, 366) of the first segment 316 and the second segment 317 taken along the second direction are substantially equal to one another. In the illustrated embodiment, at least one of the corresponding widths (e.g., 364, 366) of the first segment 316 or the second segment 317 is less than the separation distance 368 between the first segment 316 and the second segment 317 of the first photodiode region 315-1.

It is appreciated that in most embodiments the width 362 of the first photodiode region 315-1 is greater than the separation distance 368, which is greater than an isolation distance 378. The isolation distance 378 is a distance between the source/drain regions of transistors of circuitry associated with first photodiode region 315-1 and the first segment 216 or second segment 217 of first photodiode region 315-1. In some embodiments the isolation distance 378 is at least 100 nm. In the same or other embodiments, the isolation distance 378 is approximately equal to a pixel separation distance 374. The pixel separation distance 374 corresponds to the distance between photodiode regions of adjacent pixels (e.g., the distance between photodiode regions 315-1 and 315-2 or the distance between photodiode regions 315-1 and 315-0). In some embodiments, the separation distance 368 between the first segment 316 and the second segment 317 is greater than the pixel separation distance 374.

FIG. 3B illustrates a cross-sectional view along the line X4-X4' shown in FIG. 3A, in accordance with the teachings of the present disclosure. As illustrated, when view in relation to FIG. 3A, components of circuitry, such as the transfer gate 331, the reset gate 335, the source-follower gate 339, the row-select gate 343, the source/drain regions 334 associated with the corresponding pixel transistors, and the floating diffusion 332 are each disposed proximate to the first side 306 of the semiconductor substrate 305 and between, at least partially, the first segment 316 and the second segment 317 of the first photodiode region 315-1. It is appreciated that in some embodiments, the first photodiode region 315-1 includes the optional rectangular segment 313, which provides increased full well capacity. Accordingly, the first photodiode region 315-1 may be formed by the first segment 316, the second segment 317, the intermediate segment 318, and the optional rectangular segment 313. In such embodiment, part of circuitry (e.g., one or more transistors) associated with first photodiode region 315-1 may be arranged above at least part of photodiode region (e.g., above optional rectangular segment 313). Alternatively, part of the circuitry (e.g., one or more transistors) associated with first photodiode region 315-1 may overlap with the optional rectangular segment 313 of first photodiode region 315-1. It is further appreciated that in some embodiments, the optional rectangular segment 313 may be omitted. In some embodiments, the optional rectangular segment 313 may have different geometrical shape such as square.

FIG. 3C illustrates a cross-sectional view along the line Y3-Y3' shown in FIG. 3A, in accordance with the teachings of the present disclosure. As illustrated, the first segment 316, the second segment 317, and the intermediate segment 318 are coupled together to form a rectangular vertical (z-direction according to coordinate system 395) cross-section of the first photodiode region 315-1.

FIG. 3D illustrates a cross-sectional view along the line Y4-Y4' shown in FIG. 3A, in accordance with the teachings of the present disclosure. As illustrated, a first STI structure 314-A is disposed between the first segment 316 of the first photodiode region 315-1 and a second STI structure 314-B. Similarly, the second STI structure 314-B is disposed between the first STI structure 314-A and the second segment 317 of the first photodiode region 315-1. As illustrated, the first STI structure 314-A and the second STI structure 314-B provide electrical isolation between the first photodiode region 315-1 and the coupled circuitry 320 (e.g., the floating diffusion 332 illustrated in FIG. 3D and the source/drain region 334 of pixel transistors illustrated in FIG. 3E).

Additionally, it is noted that the view provided by FIG. 3D illustrates a cross-section of the transfer gate 331, which is electrically coupled to the floating diffusion 332 for selectively transferring photogenerated charges (e.g., image charge) from the first photodiode region 315-1 to the floating diffusion 332. It is appreciated that the floating diffusion 332 is disposed between the first segment 316 and the second segment 317, but is not disposed directly under the transfer gate 331, but rather is disposed out of the page (e.g., based on the coordinate system 395 illustrated in FIG, 3A). In some embodiments, each of the first STI structure 314-A and the second STI structure 314-B has an isolation depth (e.g, the depth the corresponding STI structure extends from the first side 306 into the semiconductor substrate 305) that is greater than a junction depth of the floating diffusion 332 (e.g., the depth the floating diffusion 332 extends from the first side 306 into the semiconductor substrate 305). Additionally, it is appreciated that the first photodiode region 315-1 is isolated from adjacent photodiode regions via one or more isolation structures that extend around, at least in part, the first photodiode region 315-1. In the illustrated embodiment, the one or more isolation structures include a well 319 (e.g., a P-well) disposed in the semiconductor substrate 305 with a STI structure 314 disposed within the well proximate to the first side 306 of the semiconductor substrate 305 and a DTI structure 321 disposed within the well 319 proximate to the second side 307 of the semiconductor substrate 305.

It is appreciated that in the illustrated embodiment the floating diffusion 332 may not be directly viewable in the view of cross-section Y4-Y4' shown in FIG. 3D. Rather, the floating diffusion 332, denoted with a dashed line, is provided for the sake of positional clarity (e.g., to show the floating region 332 is disposed between the first segment 316 and the second segment 317, and in some embodiment the floating region 332 is disposed above the optional rectangular segment 313).

FIG. 3E illustrates a cross-sectional view along the line Y5-Y5' shown in FIG. 3A, in accordance with the teachings of the present disclosure. FIG. 3E shows a similar view to FIG. 3D. One difference is that the view of FIG. 3D extends through the transfer gate 331 while the view of FIG, 3E extends through the reset gate 335. For example, rather than showing the floating diffusion 332, FIG. 3E illustrates the source/drain region 334. It is appreciated that the source/drain region 334 associated with the reset transistor is disposed between the first segment 316 and the second segment 317, but is not disposed directly under the reset gate 331, but rather the source/drain region 334 is disposed out of the page (e.g., based on the coordinate system 395 illustrated in FIG. 3A). It thus appreciated that in the illustrated embodiment the source/drain region 334 may not be directly viewable in the view of cross-section Y5-Y5' shown in FIG. 3E. Rather, the source/drain region 334, denoted with a dashed line, is provided for the sake of positional clarity (e.g., to show the source/drain region 334 is disposed between the first segment 316 and the second segment 317, and in some embodiment the source/drain region 334 is disposed above the optional rectangular segment 313).

It is further appreciated that FIG. 3E is representative of a cross-sectional view of other gate electrodes (e.g., the source-follower gate 339 and/or the row-select gate 343 illustrated in FIG. 3B), in accordance with embodiments of the present disclosure. In some embodiments, each of the first STI structure 314-A and the second STI structure 314-B has an isolation depth (e.g., the depth the corresponding STI structure extends from the first side 306 into the semiconductor substrate 305) that is greater than a junction depth of each of the source/drain regions 334 (e.g., the depth that each source/drain region 334 extends from the first side 306 into the semiconductor substrate 305).

It is appreciated that FIGS. 3D and 3E both illustrate the optional rectangular segment 313 disposed between the first segment 316 and the second segment 317, which results in increased full well capacity. Additionally, inclusion of the optional rectangular segment 313 further causes the circuitry (e.g., source/drain regions 334, floating diffusion 332, gate electrodes, or otherwise) to be partially encapsulated by the first photodiode region 315-1.

The processes explained above may be implemented using software and/or hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit ("ASIC"), field programmable gate array (FPGA), or otherwise.

A tangible machine-readable storage medium includes any mechanism that provides (i.e., stores) information in a non-transitory form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
a first photodiode region disposed within a semiconductor substrate proximate to a first side of the semiconductor substrate to form a first photodiode included in a first pixel, wherein the first photodiode region includes a first segment, a second segment, and an intermediate segment that couples the first segment to the second segment;
circuitry, including a first electrode associated with a first transistor, wherein the first electrode is disposed, at least in part, between the first segment and the second segment of the first photodiode region such that the circuity is at least partially surrounded by the first photodiode region when viewed from the first side of the semiconductor substrate; and
a first shallow trench isolation (STI) structure disposed within the semiconductor substrate between the first segment and the second segment of the first photodiode region, and wherein the first STI structure is disposed between the first segment of the first photodiode region and the circuitry.

2. The image sensor of claim 1, wherein the first electrode corresponds to a source region of the first transistor disposed within the semiconductor substrate between the first segment and the second segment of the first photodiode region or a drain region of the first transistor disposed within the semiconductor substrate between the first segment and the second segment.

3. The image sensor of claim 1, wherein the first photodiode region has a cross-sectional shape, including the first segment and the second segment, that forms an opening sufficient in dimension such that the circuitry, at least in part, is disposed within the opening between the first segment and the second segment when viewed from the first side of the semiconductor substrate.

4. The image sensor of claim 1, wherein, when viewed from the first side of the semiconductor substrate, the first segment and the second segment extend laterally along a first direction and the intermediate segment extends laterally along a second direction, and wherein the first direction is substantially orthogonal to the second direction.

5. The image sensor of claim 4, wherein the first segment and the second segment respectively have a first length and a second length, each taken along the first direction, wherein the intermediate segment has a first width taken along the first direction, and wherein the first width of the intermediate segment is less than at least one of the first length of the first segment or the second length of the second segment.

6. The image sensor of claim 4, wherein a separation distance between the first segment and the second segment is greater than or equal to a corresponding width of the first segment or the second segment taken along the second direction.

7. The image sensor of claim 4, wherein corresponding widths of the first segment and the second segment taken along the second direction are substantially equal to one another.

8. The image sensor of claim 7, wherein one of the corresponding widths of the first segment or the second segment is less than the separation distance between the first segment and the second segment of the first photodiode region.

9. The image sensor of claim 1, further comprising an adjacent photodiode region disposed within the semiconductor substrate proximate to the first side to form a second pixel adjacent to the first pixel, and wherein the first photodiode region is separated from the adjacent photodiode region by a pixel separation distance, wherein the first transistor is coupled to the adjacent photodiode region.

10. The image sensor of claim 9, wherein a separation distance between the first segment and the second segment of the first photodiode region is greater than the pixel separation distance between the first pixel and the second pixel.

11. The image sensor of claim 9, wherein the circuitry further includes a transfer gate of a transfer transistor that couples the adjacent photodiode region to a floating diffusion for controlling charge transfer between the adjacent photodiode region and the floating diffusion, and wherein the floating diffusion that is electrically coupled to the adjacent photodiode region is disposed, at least in part, within the semiconductor substrate between the first segment and the second segment of the first photodiode region.

12. The image sensor of claim 9, wherein the first transistor is coupled to the adjacent photodiode region for readout of the adjacent photodiode region, wherein the first transistor corresponds to a reset transistor, a source-follower transistor, or a row select transistor, and wherein the first electrode corresponds to a source region or a drain region of the first transistor, wherein the first electrode disposed within the semiconductor substrate between the first segment and the second segment of the first photodiode region is associated with readout of the adjacent photodiode region.

13. The image sensor of claim 12, wherein the first transistor corresponds to the reset transistor, wherein the reset transistor includes a reset gate, and where the circuitry further includes a source-follower gate of the source-follower transistor and a row select gate of the row select transistor, and wherein the reset gate, the row select gate, and the source-follower gate are further disposed between the first segment and the second segment of the first photodiode region when viewed from the first side of the semiconductor substrate.

14. The image sensor of claim 11, wherein the transfer gate is disposed, at least in part, between the first segment and the second segment of the first photodiode region.

15. The image sensor of claim 11, wherein the first photodiode region is separated from the adjacent photodiode region to such an extent that the transfer gate is not disposed between the first segment and the second segment of the first photodiode region.

16. The image sensor of claim 15, wherein the transfer gate has a longitudinal length greater than a separation distance between the first segment and the second segment of the first photodiode region such that the transfer gate is disposed, at least in part, between the first segment of the first photodiode region and the adjacent photodiode region.

17. The image sensor of claim 1, further comprising a floating diffusion disposed between the first segment and the second segment of the first photodiode region, and wherein the first electrode is a transfer gate that couples the first photodiode region to the floating diffusion for controlling charge transfer between the first photodiode region and the floating diffusion.

18. The image sensor of claim 1, further comprising:
two adjacent photodiode regions, each disposed proximate to the first side of the semiconductor substrate to respectively form adjacent pixels that are both laterally adjacent to the first photodiode region, wherein the two adjacent photodiode regions each have a same shape as the first photodiode region, and wherein the two adjacent photodiode regions are disposed diagonally from one another.

19. The image sensor of claim 18, further comprising an isolation structure disposed between the second segment of the first photodiode region and one of the two adjacent photodiode regions, and wherein there are no transistors disposed between the second segment of the first photodiode region and the one of the two adjacent photodiode regions.

20. The image sensor of claim 1, further including a second STI structure, wherein the first electrode is disposed between the first STI structure and the second STI structure, wherein the first STI structure is disposed between the first segment of the first photodiode region and the first electrode, and wherein the second STI structure is disposed between the first electrode and the second segment of the first photodiode region.

21. The image sensor of claim 20, wherein the first electrode is a drain region of the first transistor or a source region of the first transistor, wherein at least one of the first STI structure or the second STI structure has an isolation depth that extends into the semiconductor substrate greater than a junction depth of the first electrode such that the first STI structure and the second STI structure provide electrical isolation between the first electrode and the first photodiode region.

22. The image sensor of claim 1, wherein the intermediate segment couples the first segment to the second segment such that a first cross-section of the first photodiode region proximate to the first side of the semiconductor substrate forms a shape with an opening and a second cross-section of the first photodiode region proximate to a second side of the semiconductor substrate has a polygonal shape, wherein the second side is opposite of the first side of the semiconductor substrate.

23. The image sensor of claim 22, wherein the first photodiode region further includes a third segment coupled to the first segment, the second segment, and the intermediate segment, wherein the second cross-section extends through the third segment, wherein the third segment is disposed between the second side of the semiconductor substrate and each of the first segment, the second segment, and the intermediate segment, and wherein at least a part of the first transistor overlaps with a part of the third segment of the first photodiode such that the part of the third segment is disposed between the first transistor and the second side of the semiconductor substrate.

24. An image sensor, comprising:
a first photodiode region disposed within a semiconductor substrate proximate to a first side of the semiconductor substrate to form a first photodiode included in a first pixel, wherein the first photodiode region includes a first segment, a second segment, and an intermediate segment that couples the first segment to the second segment;
circuitry, including a floating diffusion associated with a transfer transistor, wherein the floating diffusion is disposed, at least in part, within the semiconductor substrate between the first segment and the second segment of the first photodiode region; and
an isolation structure disposed within the semiconductor substrate between the first segment and the second segment of the first photodiode region, wherein the isolation structure includes at least one of a shallow trench isolation structure or a deep trench isolation structure disposed between the first segment of the first photodiode region and the circuitry.

25. The image sensor of claim 24, wherein the isolation structure further includes an implanted well, wherein the implanted well has an opposite conductivity type relative to the first photodiode region.

26. The image sensor of claim 1, wherein the circuitry corresponds to control circuitry for readout of the first photodiode region or an adjacent photodiode region, wherein the control circuitry includes a transfer transistor corresponding to the first transistor, a source-follower transistor, a row select transistor, and a reset transistor, and wherein at least one of a source region or a drain region for each of the transfer transistor, the source-follower transistor, the row select transistor, and the reset transistor are disposed within the semiconductor substrate between the first segment and the second segment of the first photodiode region.

27. The image sensor of claim 1, wherein the first segment, the second segment, and the intermediate segment form a monolithic unit corresponding to the first photodiode region.

28. The image sensor of claim 1, wherein the first segment, the second segment, and the intermediate segment of the first photodiode region have an opposite conductivity type relative to a corresponding conductivity type of the semiconductor substrate.

\* \* \* \* \*

UNITED STATES PATENT AND TRADEMARK OFFICE
CERTIFICATE OF CORRECTION

PATENT NO. : 12,062,670 B2
APPLICATION NO. : 17/243024
DATED : August 13, 2024
INVENTOR(S) : Hui Zang et al.

Page 1 of 1

It is certified that error appears in the above-identified patent and that said Letters Patent is hereby corrected as shown below:

In the Claims

| Column | Line | |
|---|---|---|
| 18 | 42 | change "the separation" to -- a separation --. |

Signed and Sealed this
Fifteenth Day of July, 2025

Coke Morgan Stewart
*Acting Director of the United States Patent and Trademark Office*